SYSTEM FOR VARYING CAPACITANCE

Filed Aug. 25, 1958 3 Sheets-Sheet 1

INVENTOR.
GEORGE ROSEN
BY
ATTORNEYS

July 26, 1960 G. ROSEN 2,946,969

SYSTEM FOR VARYING CAPACITANCE

Filed Aug. 25, 1958 3 Sheets-Sheet 2

INVENTOR.
GEORGE ROSEN
BY [signature]
ATTORNEYS

July 26, 1960 G. ROSEN 2,946,969

SYSTEM FOR VARYING CAPACITANCE

Filed Aug. 25, 1958 3 Sheets-Sheet 3

INVENTOR.
GEORGE ROSEN

BY

Wade Koontz
George Fine
ATTORNEYS

United States Patent Office 2,946,969
Patented July 26, 1960

2,946,969

SYSTEM FOR VARYING CAPACITANCE

George Rosen, Philadelphia, Pa., assignor to the United States of America as represented by the Secretary of the Air Force Filed Aug. 25, 1958, Ser. No. 757,168

5 Claims. (Cl. 333—80)

This invention relates to a variable capacitance and particularly to a capacitance whose value may be varied in accordance with a control signal.

The variation of the value of a capacitance has great utility in many electronic and electrical circuits. In many instances it would be very desirable to vary the frequency of an oscillator in accordance with a control signal. In the present invention the value of a capacitance may be varied by utilizing a control signal. This variable capacitance may be a part of an LC resonant circuit of an oscillator, and may be employed to vary the frequency by the application of a control voltage.

In another instance, an LC configuration may be utilized as a band-pass network whose characteristics are determined by the value of inductance and capacitance. The value of capacitance may be varied by a control voltage and thereby provide a control of the band-pass characteristics of an LC configuration.

The present invention may be incorporated in the Dynamic Analog Speech Synthesizer disclosed and claimed in my application Serial No. 757,170, filed August 25, 1958, and may be utilized therein to vary the value of a capacitance in accordance with the value of a control voltage.

The variable capacitance is realized by means of the Miller effect. The Miller effect depends on an amplifier to magnify the capacitance of a fixed physical capacitor. The apparent magnified capacitance appears between the input terminals of the amplifier and its magnitude is controlled by the gain of the amplifier.

In the present invention the gain of the amplifier is controlled by a novel electronic attenuator whose gain is determined by a control voltage input. The electronic attenuator utilizes electron discharge devices as variable resistors instead of as variable gain amplifiers.

The attenuator is designed as a resistance ladder with the plate resistances of the electron discharge devices as shunt arms, utilizing electron discharge devices in the shunt arms permitted the grounding of all the attenuator electron discharge devices cathodes.

The attenuator is useful to zero frequency because reactive elements or transformers are not needed for coupling between the electron discharge devices that are incorporated in the attenuator. By connecting small capacitors across each series resistor the high frequency asymptotic behavior can be made that of a capacitive voltage divider for which the slope of the attenuation curve is zero in the neighborhood of infinite frequency. It is impossible to put a capacitor across the (hypothetical) plate resistancee ($r_p$) of an electron discharge device used as an amplifier in order to achieve the same effect.

In this embodiment of the attenuator general purpose medium mu triodes were utilized as the electron discharge devices. The triodes are used as the shunt tubes. To minimize the effect of spray capacity to ground, low resistances are used in the series arms; the impedance level of the resistance coupling networks usually used for audio amplifiers is at least an order of magnitude too high.

Each series resistance, however, is several times the minimum plate resistance of its associated shunt tube in order to achieve appreciable attenuation per stage. The upper limit to each series resistance is set by the great curvature of the curves $e_c$=constant in the $e_b$, $i_b$ plane for low currents.

The overall attenuation is a function of the aforementioned control voltage utilized to vary the value of capacitance. Thus it is necessary to provide the proper voltage at the grid of each shunt tube as a function of the control voltage.

The circuit between the control voltage input and each grid of the aforesaid attenuator is a network of linear resistors. As a first approximation, a resistance network loaded by a grid can be considered to be piecewise linear with a single breakpoint caused by grid conduction.

The wide range of the attenuator is made possible by operating each of its tubes in regions extending from cutoff to positive grid. The attenuation of each section depends not only on the operating point of the corresponding tube but also on the operating points of the other tubes. The operating point of each tube depends not only on its grid voltage but also on the operating points of adjacent tubes and on the resistances joining them together.

With the attenuator and its grid network of resistances, there must be a D.C. level stabilization. The "level stabilizer" provides to a summation point a component of voltage or current whose magnitude and polarity cancel the voltage or current variation due to changes in level at the output of the attenuator. The "level stabilizer" is connected between the attenuator control source and the output amplifier, to stabilize the D.C. level of the signal applied to an output amplifier against variation due to changes of operating points in the attenuator.

In accordance with the present invention, the value of a capacitance is varied in accordance with a control voltage, $V_{cc}$. The variable capacitance is provided by means of the Miller effect in an amplifier whose gain is varied. The amplifier is comprised of a high gain input stage, an electronic attenuator, and a low impedance output stage.

The electronic attenuator is a ladder attenuator utilizing vacuum tubes as the shunt elements and fixed resistors as the series elements. The use of several tubes relaxes requirements on any one tube. The use of variable $r_p$ instead of variable mu provides high-signal handling ability. Confining the connection between attenuator stages to the plate circuit permits drastic uncompensated operating point changes to occur in an early stage of the attenuator without disabling a late stage.

The aforesaid novel electronic attenuator has many other applications in addition to its utilization in the present invention. It provides a wide range of attenuation, high signal handling ability, plus a broad bandwidth.

A non-linear circuit "the level stabilizer" is utilized between the attenuator control source, $V_{cc}$ and the aforesaid output amplifier, to stabilize the D.C. level of the signal applied to the output amplifier against variation due to changes of operating points in the attenuator.

It is an object of the present invention to provide a system for varying the value of a capacitance in accordance with the value of a control voltage.

It is another object of the present invention to vary the value of a capacitance by varying the gain of an amplifier in accordance with the value of a control voltage.

It is still another object of the present invention to vary the value of a capacitance by attenuating the gain of an amplifier wherein aforesaid attenuation is varied in accordance with the value of a control voltage.

A further object of the present invention is to vary the value of a capacitance by utilizing a novel attenuation system in controlling the gain of an amplifier.

For a better understanding of the present invention, together with other and further objects thereof, reference is had to the following description taken in connection with the accompanying drawings, and its scope will be pointed out in the appended claims.

Figure 1:
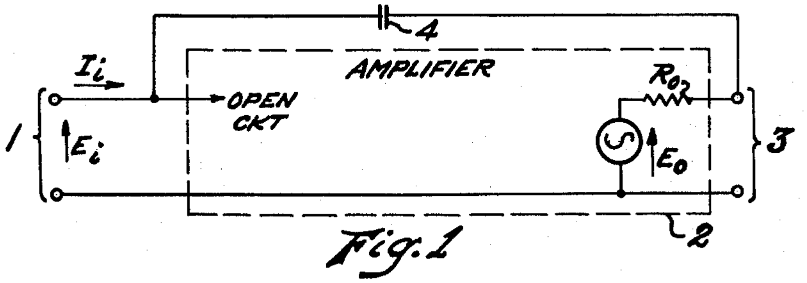
Fig. 1 illustrates the Miller effect.

Now referring to Fig. 1, to illustrate the utilization of the Miller effect, a signal voltage appears across terminal 1. This signal voltage is fed to amplifier 2. The output voltage of the amplifier is inverted with respect to its input. The fixed capacitor 4 is connected between upper output terminal 3 and upper terminals 1. The impedance looking into the amplifier 2 is $$Z_i=\frac{E_i}{I_i}=\frac{R_0+\frac{1}{j\omega C_4}}{1+K\angle^{\theta}}$$

In the useful band of the amplifier $R_0$ and $\theta$ are made small so that $$Z_i=\frac{1}{j\omega C_i}=\frac{1}{j\omega(1+K)C_4}$$

and, therefore, $$C_i=(1+K)C_4$$

Thus, an apparent variable capacitance is seen at terminals 1 of the amplifier; the capacitance of the fixed capacitor magnified by one plus the gain of the amplifier.

Figure 2:
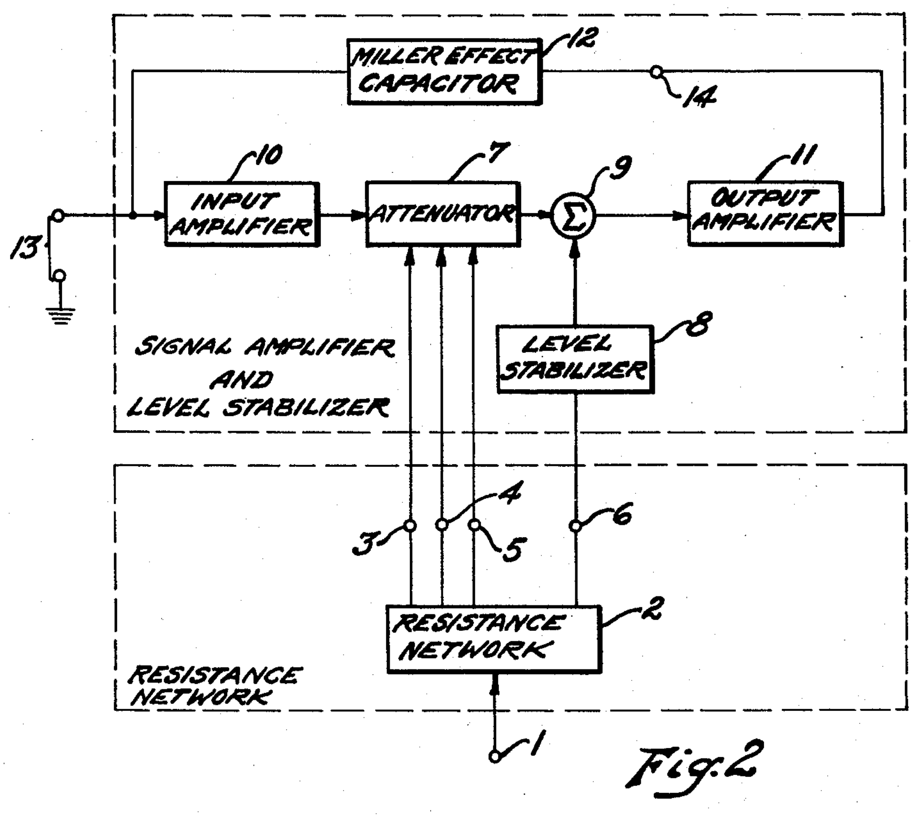
Fig. 2 shows a block diagram of a variable capacitance system analogous to certain components of the Speech Synthesizer System disclosed in my companion patent application above identified.

Referring to Fig. 2, resistance network 2 is adapted to receive a control voltage, $V_{cc}$, from terminals 1. Resistance network 2 is so arranged that there are provided four outputs, 3, 4, 5 and 6 respectively. Each of the outputs 3, 4 and 5 are connected to one of the grids of the triode tubes in electronic attenuator 7. Output 6 is connected to the input of level stabilizer 8.

Figure 5:
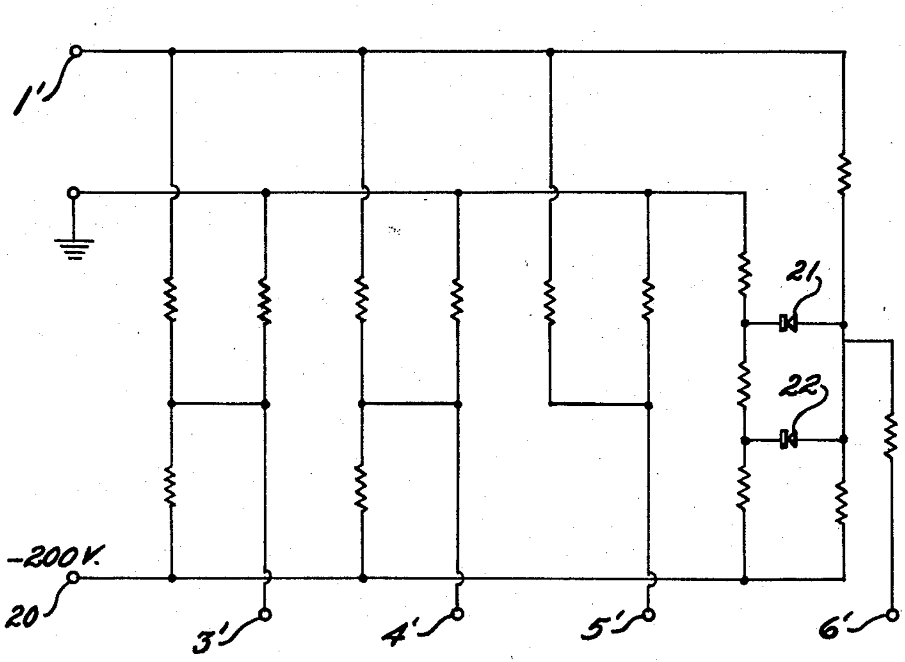
Fig. 5 shows a resistance network in the grid circuits of the electronic attenuator.

Now referring to Fig. 5, showing a schematic diagram of the resistance network shown in Fig. 2, input terminal 1′ is adapted to receive a control voltage, $V_{cc}$. Terminal 20 is adapted to receive —200 volts. The resistance network provides control voltages of varying amplitudes to be provided at output terminals 3′, 4′ and 5′, respectively, in accordance with the resistance ratios, $V_{cc}$ amplitudes and grid conduction effects. The output at terminal 6′ is provided by means of the resistance ratios in the network and diodes 21 and 22 in response to control voltage $V_{cc}$.

Figure 6:
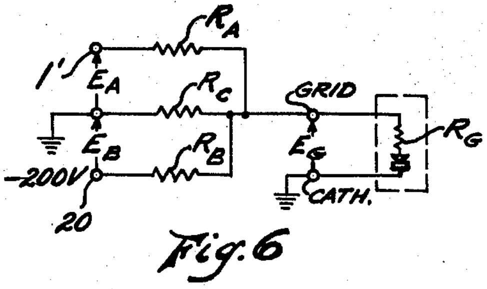
Fig. 6 shows the general resistance network utilized in the grid of attenuator tubes.
Figure 7:
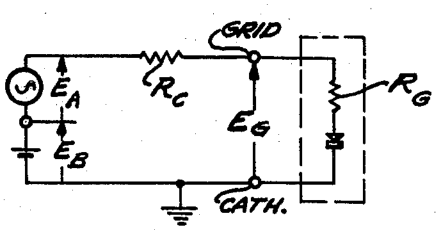
Fig. 7 is the equivalent circuit of the network shown in Fig. 5.

Fig. 6 shows the general resistance network from which the network in Fig. 5 is derived. To a first approximation, a resistance network loaded by a grid can be considered to be piecewise linear, with a single breakpoint caused by grid conduction. The relation between the voltage at any grid and the control voltage, $V_{cc}$, at terminal 1′ is completely described by the following; control voltage at which grid conduction begins; incremental gain from terminal 1′ to grid in the region of grid conduction; and incremental gain from terminal 1′ to grid in region of non-conduction. The simplest suitable resistance network is shown in Fig. 6. The equivalent circuit of this network is given in Fig. 7, where $$\frac{R_A}{R_c}=A \text{ and } \frac{R_B}{R_c}=B \text{ by definition}$$

Both the point at which grid conduction begins and the incremental gain in the non-conduction region are determined by the choice of resistance ratios A and B. The incremental gain in the conduction region is then determined by choice of $R_c$. The choice of $R_c$ is equivalent to the choice of the resistance level of the network.

Now referring again to Fig. 2, control voltages are available at terminals 3, 4, 5 and 6 whose amplitudes are determined by network 2 in accordance with the amplitude of the control voltage $V_{cc}$ fed in at terminals 1. Control voltages 3, 4 and 5 are fed to electronic attenuator 7.

Figure 3:
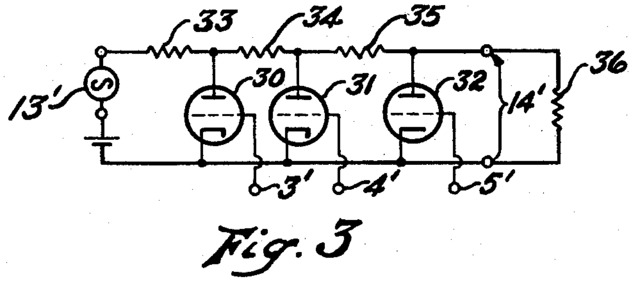
Fig. 3 shows an electronic ladder attenuator network utilizing tubes as the shunt element and fixed resistors as the series element.

The operation of electronic attenuator 7 is shown in greater detail by referring to Fig. 3. An electronic attenuator network is shown using tubes 30, 31, and 32 as shunt elements and fixed resistors 33, 34 and 35 respectively as the series elements. The control voltages are provided from terminals 3′, 4′ and 5′, respectively. The signal to be attenuated is represented by generator 13′ and the attenuated signal is taken from terminal 14′. Low resistances are utilized in series arms 33, 34 and 35, respectively, however, they are several times the minimum plate resistances of the shunt tubes 30, 31, and 32, respectively. The upper limit to each series resistance is set by the great curvature of curves $e_c$=constant $e_b$, $i_b$ for low currents. The plate resistance of tubes 30, 31 and 32, respectively, are utilized as shunt arms. Resistors 33, 34 and 35 respectively are utilized as series resistors. Control voltages from terminals 3′, 4′ and 5′ control the current flow in tubes 30, 31 and 32, respectively, and thereby determine the total attenuation that a signal sees from input terminals to output terminals. In effect there is provided by the electronic attenuator a resistance ladder whose attenuation is determined by the control voltages received at terminals 3′, 4′, and 5′.

Figure 4:
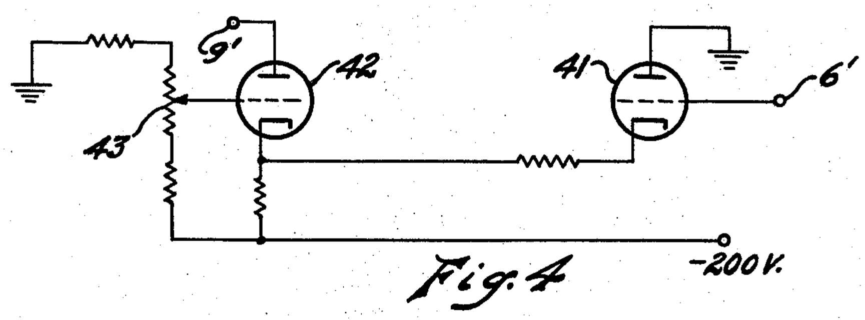
Fig. 4 shows a schematic of the "level stabilizer" circuit.

Now referring again to Fig. 2, electronic attenuator 7 varies the magnitude of its attenuation in response to control voltages provided from terminals 3, 4, and 5, respectively. This variation in gain is in response to control voltage, $V_{cc}$, from terminals 1. However, since the D.C. level of the output voltage varies, then there must be a stabilization thereof. Level stabilizer 8, in response to control voltage $V_{cc}$, by way of network 2, provides to summation point 9 a component of voltage or current whose magnitude and polarity cancel the voltage or current variation due to changes in level at the output of attenuator 7. The schematic circuit of the level stabilizer is shown in Fig. 4. Tube 42 draws sufficient plate current to make the voltage at output terminal 9′ slightly negative and thus provides bias for the output amplifier 11 of Fig. 2. The bias is adjusted by potentiometer 43.

Together tubes 41 and 42 function as a current generator which injects current into output terminal 9′ and which is controlled by the voltage from terminal 6′. The current generator operates into a resistance load. Its polarity is such that $\Delta V$ at output terminal 9′ due to $\Delta V$ at terminal 6′ has the same sign as $\Delta V$ at terminal 6′. Thus no voltage inversion is required between terminals 1 of Fig. 2 and terminal 6 of Fig. 2.

Referring once again to Fig. 2, variable capacitance is obtained by varying the gain of an amplifier whose output terminals 14 and input terminals 13 are connected by means of fixed capacitor 12. The amplifier is comprised of input amplifier 10, electronic attenuator 7 and output amplifier 11. Input amplifier 10 is utilized to amplify the input so that attenuator 7 operates at signal voltages comparable to the D.C. voltage variations within the attenuator.

To obtain a variable capacitance across terminals 13, a control voltage, $V_{cc}$, is injected in terminals 1. Control voltages are derived from network 2 and are injected into attenuator 7. The attenuation of attenuator 7 is varied in accordance with control signal, $V_{cc}$. The gain between input amplifier 10 and output amplifier 11 is controlled by means of attenuator 7. Since fixed capacitor 12 is connected between input amplifier 10 and output amplifier 11, then variation of the gain will produce a variation in the capacitance across terminals 13 in response to variation in control voltage, $V_{cc}$.

Figure 8:
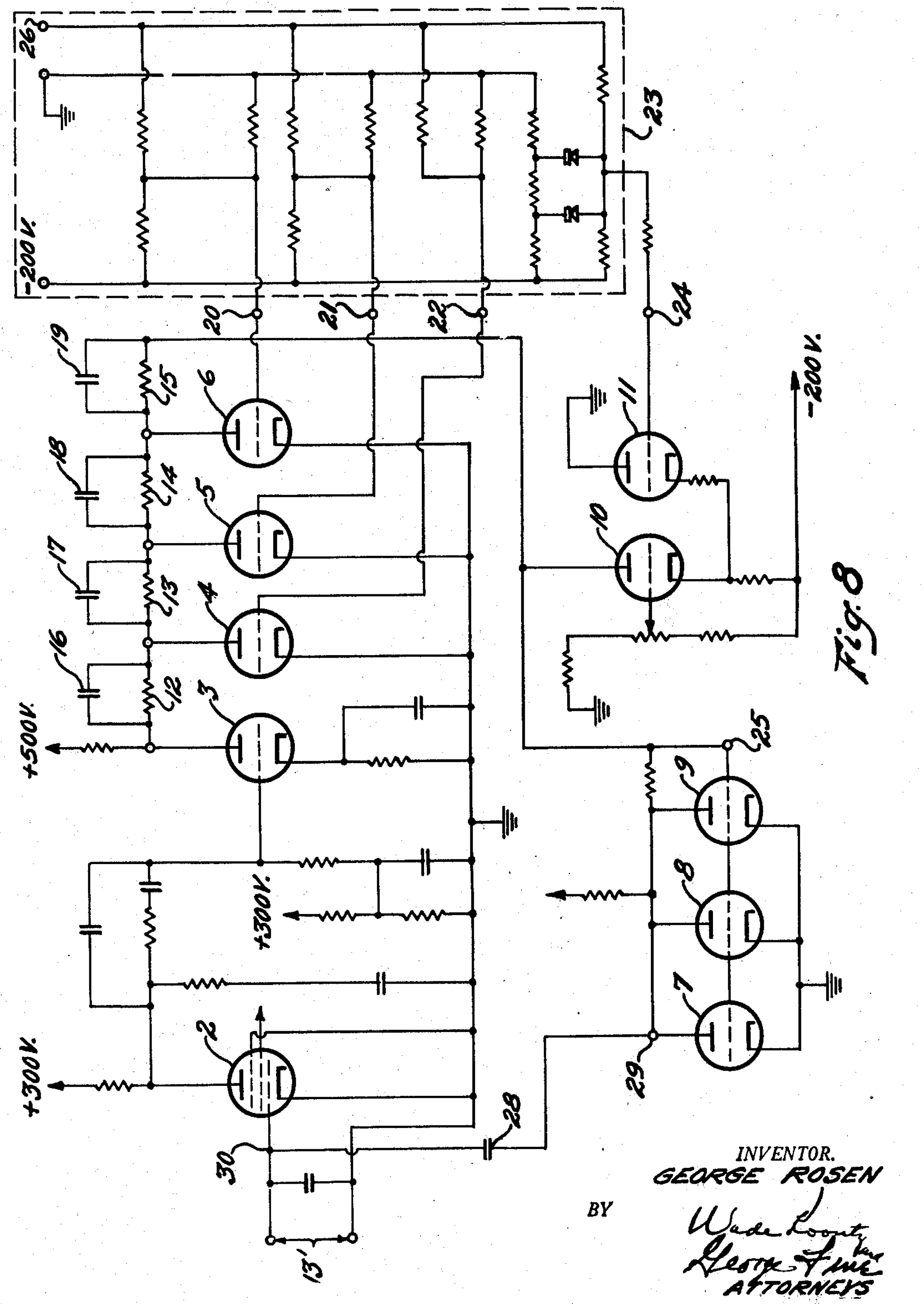
Fig. 8 shows the schematic diagram of the variable capacitance system.

Referring to Fig. 8 showing the schematic diagram of the variable capacitance system, across terminal 13' appears the variable capacity. Tube 2 and its associated circuitry represents the input amplifier. Tubes 4, 5, and 6, respectively, represent successive stages in the electronic attenuator, which tubes serve as shunts. Resistors 12–14 serve as series resistor. Capacitors 16–19 are connected across resistors 12–15 respectively, and serve to make the high-frequency asymptotic behavior that of a capacitor voltage divider for which the phase shift approaches zero at the high frequencies. Control voltages for tubes 4–6 are provided by terminals 20–22 respectively. These control voltages are derived from the resistance network 23. Tubes 10 and 11 and associated circuitry function as a D.C. level stabilizer for the electronic attenuator and receives its control voltage from terminal 24 of resistance network 23. The output from tube 6 is fed to terminal 25 which is the input terminal for output amplifier comprising tubes 7–9 and their associated circuitry. Resistance network 23 receives its control voltage, $V_{cc}$, from terminal 26. Fixed capacitor 28 is connected between terminal 29 and terminal 30.

Many variations and modifications of the invention will occur to those skilled in the art to which the invention relates, and it is accordingly intended that the claims that shall follow shall not be limited, but only illustrated by the details of the preferred embodiment of the invention shown and described.

What is claimed is:

1. A system for precisely varying the value of a capacitance in accordance with a control signal comprising a pair of amplifiers, a fixed capacitor connected between the output terminal of the second of said amplifiers and the input terminal of the first of said amplifiers, said first amplifying means having an input circuit characterized by a regulable degree of capacitance effective thereacross, means following said first amplifier and preceding said second amplifier interconnecting said pair of amplifiers and operating to precisely attenuate the output voltage of said first of said amplifiers and thereby regulate the value of said input circuit capacitance, said attenuating means serving as a resistance ladder by including a multiplicity of electron discharge devices arranged with the plate resistances of said electron discharge devices as shunt arms and fixed resistances as series arms, means to inject a signal of the proper polarity and magnitude at the output terminal of said attenuating means to stabilize the direct current output level from said attenuating means, and a resistance network simultaneously controlling said attenuating means and said signal injection means in accordance with said control signal.

2. A system for varying the value of a capacitance in accordance with a control signal comprising a pair of amplifying means, the second of which includes an output circuit having connection with the input terminal of the first of said amplifying means, said first amplifying means having an input circuit characterized by a regulable degree of capacitance effective thereacross, a fixed capacitor constituting part of said output circuit, means following said first amplifying means and preceding said second amplifying means interconnecting said pair of amplifying means to precisely attenuate the output voltage of the first of said amplifying means and thereby regulate the value of said input circuit capacitance, said attenuating means including electron discharge devices so arranged that said electron discharge devices plate resistances are utilized as shunt arms and fixed resistances are arranged as series arms thereby operating as a resistance ladder, resistance network means to control the emission of said electron discharge devices in accordance with the magnitude of said control signal, and means to inject a signal of the proper polarity and magnitude at the output terminal of said attenuating means to stabilize the direct current output level of said atenuating means also in accordance with said control signal.

3. A system for varying the value of capacitance in accordance with a control signal comprising a pair of amplifying means, the first of said amplifying means having an input circuit characterized by a regulable degree of capacitance effective thereacross, a fixed capacitor connected between the output terminal of the second of said amplifying means and the input terminal of said first of said amplifying means, attenuating means following said first amplifying means and preceding said second amplifying means interconnecting said pair of amplifying means, said attenuating means operating as a resistance ladder to vary the output voltage of said first amplifying means in accordance with the magnitude of said control voltage and thereby regulate the value of said input circuit capacitance, and stabilizing means to inject a signal of the proper polarity and magnitude at the output terminal of said attenuating means to control the variations in the direct current output level of said attenuating means also in accordance with said control signal.

4. In a system as defined in claim 3 wherein said attenuating means is comprised of a ladder attenuator utilizing electron discharge devices as shunt elements and fixed resistors as series elements.

5. In a system as defined in claim 4 wherein said attenuating means is comprised of a ladder attenuator utilizing electron discharge devices as shunt elements and fixed resistors as series elements, and means to control each of said electron discharge devices in accordance with the magnitude of said control voltage.

References Cited in the file of this patent

UNITED STATES PATENTS

| | | |
|---|---|---|
| 1,950,759 | Terman | Mar. 13, 1934 |
| 2,088,439 | Rothe | July 27, 1937 |
| 2,510,787 | Wheeler | June 6, 1950 |
| 2,585,854 | Scott | Feb. 12, 1952 |
| 2,590,753 | Clapp | Mar. 25, 1952 |